United States Patent
Pai et al.

(10) Patent No.: US 11,215,923 B1
(45) Date of Patent: Jan. 4, 2022

(54) METHOD FOR MANUFACTURING LARGE-SCALE TOUCH SENSING PATTERN

(71) Applicants: Chih-Chiang Pai, Taoyuan (TW); Meng-Kuei Lin, Taoyuan (TW); Jung-Han Liu, Taoyuan (TW)

(72) Inventors: Chih-Chiang Pai, Taoyuan (TW); Meng-Kuei Lin, Taoyuan (TW); Jung-Han Liu, Taoyuan (TW)

(73) Assignee: YOUNG FAST OPTOELECTRONICS CO., LTD., Taoyuan (TW)

( * ) Notice: Subject to any disclaimer, the term of this patent is extended or adjusted under 35 U.S.C. 154(b) by 0 days.

(21) Appl. No.: 16/945,933

(22) Filed: Aug. 3, 2020

(51) Int. Cl.
G03F 7/00 (2006.01)
G02B 6/136 (2006.01)
G03F 7/20 (2006.01)
G06F 3/044 (2006.01)
G06F 3/041 (2006.01)

(52) U.S. Cl.
CPC .......... *G03F 7/0035* (2013.01); *G03F 7/2014* (2013.01); *G06F 3/044* (2013.01); *G06F 3/0412* (2013.01)

(58) Field of Classification Search
None
See application file for complete search history.

(56) References Cited

U.S. PATENT DOCUMENTS

| | | | | |
|---|---|---|---|---|
| 5,710,061 A * | 1/1998 | Cleeves | ............ | H01L 21/76808 438/618 |
| 9,536,685 B2 * | 1/2017 | Lee | .......... | G06F 3/047 |
| 10,489,001 B2 * | 11/2019 | Xiao | ...................... | B05D 3/002 |
| 10,824,255 B2 * | 11/2020 | Chen | ...................... | G06F 3/0446 |
| 2009/0096090 A1 * | 4/2009 | Chang | ................. | G03F 7/70441 257/734 |
| 2020/0103750 A1 * | 4/2020 | Zheng | ....................... | G03F 7/22 |

* cited by examiner

Primary Examiner — Shamim Ahmed (57) ABSTRACT

The method includes the steps of: a) dividing a large-scale touch sensing pattern to be manufactured into multiple divisional patterns and producing multiple photomasks corresponding to the multiple divisional patterns; b) providing a substrate with a conductive layer; c) disposing a photoresist layer on the conductive layer; d) a first exposure process: forming an exposing divisional pattern and multiple first targets the photoresist layer; e) an adjacent exposure process: forming an adjacent exposing divisional pattern and multiple second targets, and adjacently connecting the adjacent exposing divisional pattern and the exposing divisional pattern originally on the photoresist layer; f) repeating the adjacent exposure process to form multiple adjacent exposing divisional patterns until a complete exposing pattern has been assembled; g) performing a developing process to the photoresist layer; and h) etching the conductive layer to form the large-scale touch sensing pattern on the conductive layer.

5 Claims, 13 Drawing Sheets

METHOD FOR MANUFACTURING LARGE-SCALE TOUCH SENSING PATTERN

TECHNICAL FIELD

The invention relates to a method for manufacturing a large-scale touch sensing pattern, particularly to a method of connecting multiple divisional exposing patterns into a complete exposing pattern and etching the complete exposing pattern to form a large-scale touch sensing pattern.

RELATED ART

Touch panels have been widely applied in various electronic devices. Those touch panels which are combined with large-size displays, such as ATMs, self-service kiosks, electronic whiteboards in department stores, vehicle touch devices and other business machines, are limited by production technologies and the yield rate of attaching, so they usually adopt the resistive type, the sonic type or the external optical type. However, people are used to the multitouch function of smartphones and tablets, so manufacturers are developing solutions of multitouch function applied to middle-size or large-size displays. Currently, middle-size or large-size multitouch products with above 10 inches are based on capacitive touch technology. A capacitive touch panel includes a substrate, a conductive layer formed on the substrate, and a shielding layer and a flexible circuit board formed on the substrate and around the conductive layer. The conductive layer usually adopts an ITO film. The conductive layer is formed by the photo process and etching to form capacitive sensing strings on the conductive layer. The capacitive sensing strings are connected with the flexible circuit board via transmission wires.

The photo process includes disposing a photoresist layer on the ITO conductive layer, exposing the photoresist layer with a photomask having a capacitive sensing strings pattern to make the photoresist material solidify due to polymerization resulting from irradiation of UV light, and removing the photoresist material of non-exposed portions of the photoresist layer with developer. As a result, a solidified photoresist layer corresponding to the photomask pattern is formed on ITO.

Because size requirements of touch panels become larger and larger, it is possible to happen that a workpiece of touch panel exceeds the limitation of maximum size of the photo process machine. This results in a touch sensing pattern being unable to be completely formed on the photoresist layer in a single photo process. This is a real problem. However, purchasing a larger-scale photo process machine is very expensive and will cause increase of the production costs.

Figure 15:
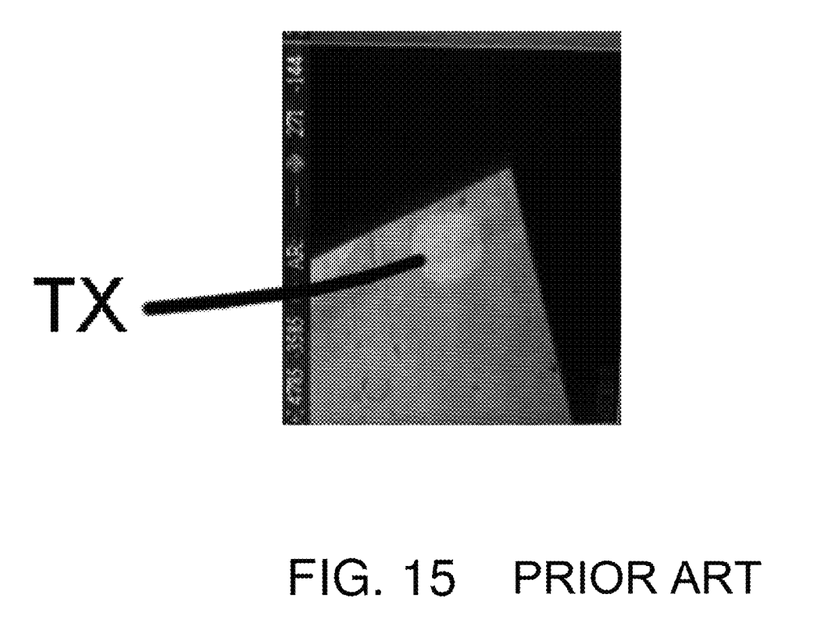
FIG. 15 is a schematic view of a conventional photoresist layer, which shows the CCD observer possessing a bad recognition rate to the target pattern.

Some manufacturers try to segmentalize exposure to the touch sensing pattern and then assemble them to form an integral. In other words, the touch sensing pattern is divided into multiple divisional patterns, then these divisional patterns are separately exposed to form a solidified photoresist material with a corresponding pattern on the photoresist layer, and finally, the multiple divisional patterns are combined into a complete touch sensing pattern on the photoresist layer. This combining approach requires precision positioning to avoid errors in the complete touch sensing pattern. Current exposure process machines utilize a CCD observer to serve as a positioning adjustment system. A light source of the CCD observer is blue light with wavelength of 450~465 nm. The pattern on the photoresist layer in the exposure process is formed by the photoresist material which is exposed and solidified and is not treated by the developing process yet. In practice, the solidified photoresist material possesses worse reflectivity to blue light, so the CCD observer possesses a bad recognition rate to the target pattern TX on the photoresist layer as shown in FIG. 15. This causes difficulties of positioning and results in errors in a complete touch sensing pattern.

SUMMARY OF THE INVENTION

An object of the invention is to provide a method for manufacturing a large-scale touch sensing pattern, which can manufacture a large-size exposing pattern by a small-size exposure machine.

To accomplish the above object, the method for manufacturing a large-scale touch sensing pattern of the invention includes the steps of:

a) dividing a large-scale touch sensing pattern to be manufactured into multiple divisional patterns and producing multiple photomasks corresponding to the multiple divisional patterns, wherein the multiple divisional patterns comprise a first divisional pattern and adjacent divisional patterns, and margins of the multiple divisional patterns contains overlapping pattern portions;

b) providing a substrate with a conductive layer;

c) disposing a photoresist layer on the conductive layer, wherein the photoresist layer possesses photosensitivity to ultraviolet (UV) rays;

d) performing a first exposure process: using a first photomask to expose the photoresist layer, the first photomask having a first divisional pattern mold and multiple first target pattern molds, a pattern of the first divisional pattern mold corresponding to the first divisional pattern, using UV rays to irradiate the photoresist layer through the first photomask, and transferring a pattern of the first photomask onto the photoresist layer to form an exposing divisional pattern and multiple targets;

e) performing an adjacent exposure process: using a light source with wavelength of 620 nm~750 nm to irradiate the targets of the photoresist layer to perform a positioning operation, after positioning the exposing divisional pattern and an adjacent photomask, using the adjacent photomask to expose the photoresist layer, the adjacent photomask having a having an adjacent divisional pattern mold and multiple second target pattern molds, a pattern of the adjacent divisional pattern mold corresponding to one of the adjacent divisional patterns of the large-scale touch sensing pattern, using UV rays to irradiate the photoresist layer through the adjacent photomask, transferring a pattern of the adjacent photomask onto the photoresist layer to form an adjacent exposing divisional pattern and multiple targets, and adjacently connecting the adjacent exposing divisional pattern and the exposing divisional pattern originally on the photoresist layer;

f) repeating the adjacent exposure process to form multiple adjacent exposing divisional patterns until a complete exposing pattern has been assembled, the complete exposing pattern corresponding to the large-scale touch sensing pattern;

g) performing a developing process to the photoresist layer to form a solidified photoresist layer with the complete exposing pattern on the conductive layer; and h) performing an etching process to the conductive layer to form the large-scale touch sensing pattern on the conductive layer.

In the invention, each of the overlapping pattern portions is less than 0.1 mm in width.

In the invention, the photoresist layer comprises a color changing agent for promoting the photoresist layer to change from colorless to colored when the photoresist layer is irradiated by UV rays.

In the invention, the color changing agent is leuco crystal violet (LCV), diphenylamine, triphenylamine or dibenzylaniline.

In the invention, the positioning targets are arranged outside the exposing divisional patterns and apart from each other.

DETAILED DESCRIPTION OF THE INVENTION

A preferred embodiment of the invention uses an exposure machine with a native working size of 550 mm×600 mm to produce a large-scale touch sensing pattern with a size of 500 mm×1100 mm, as an example. In brief, the manufacturing method is to properly divide a large-scale touch sensing pattern to be manufactured into three divisional patterns and then to produce three photomasks with corresponding patterns. Three exposing divisional patterns and three positioning targets are formed on the photoresist layer by three exposure processes. In the exposure process after the second exposure process, positions of the exposing divisional patterns which are adjacently connected can be adjusted by the positioning targets serving as alignment basis which were formed in the former exposure process so as to make the exposing divisional patterns accurately connected to form a complete exposing pattern with a size of 550 mm×1100 mm. Finally, the complete exposing pattern is used to etch the conductive layer to manufacture a large-scale touch sensing pattern with a size of 550 mm×1100 mm.

Figure 1:
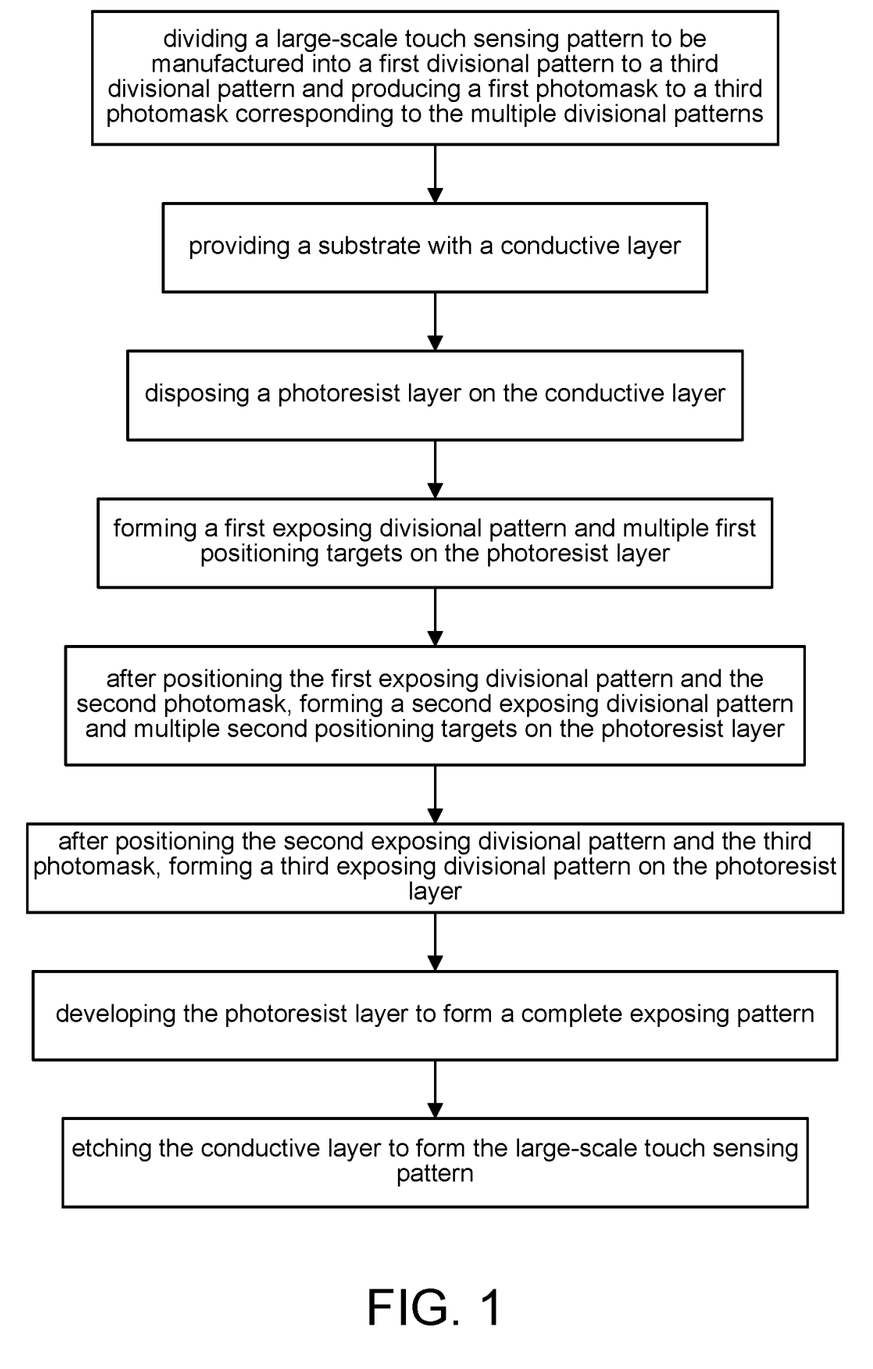
FIG. 1 is a flowchart of the method of the invention.

As shown in FIG. 1, the method for manufacturing a large-scale touch sensing pattern of the invention includes the following steps.

Step a): dividing a large-scale touch sensing pattern S to be manufactured into a first divisional pattern S1, a second divisional pattern S2 and a third divisional pattern S3 and producing a first photomask M1, a second photomask M2 and a third photomask M3, which separately correspond to the multiple divisional patterns S1-S3.

Figure 2:
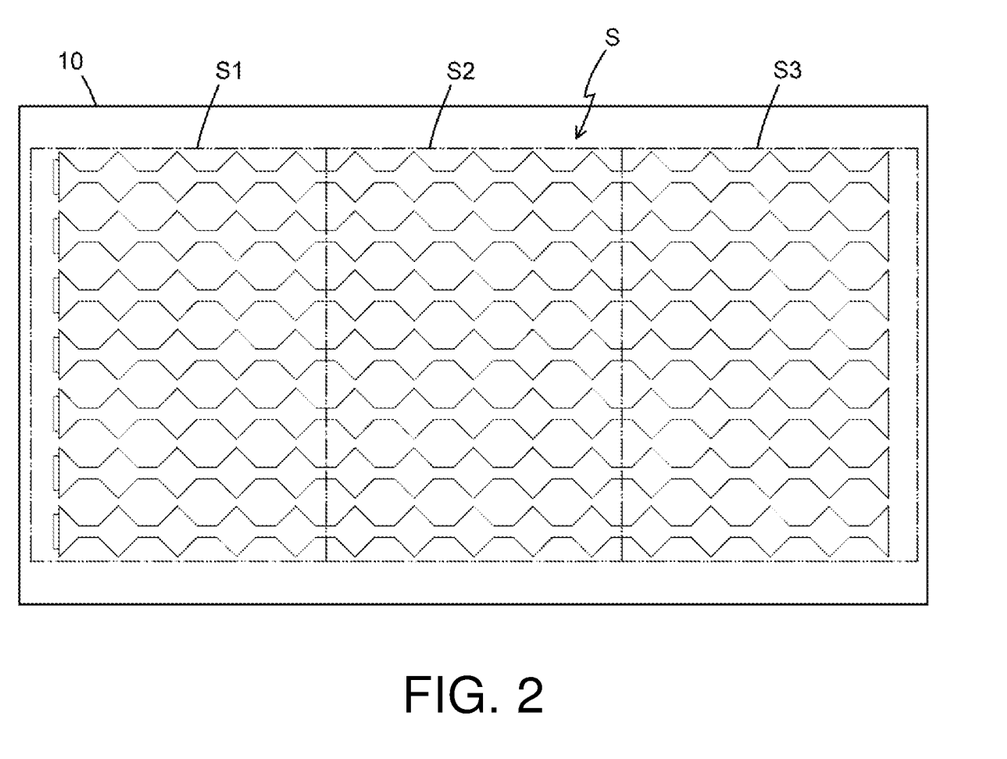
FIG. 2 is a schematic view of the invention, which shows dividing a large-scale touch sensing pattern into multiple divisional patterns.
Figure 8:
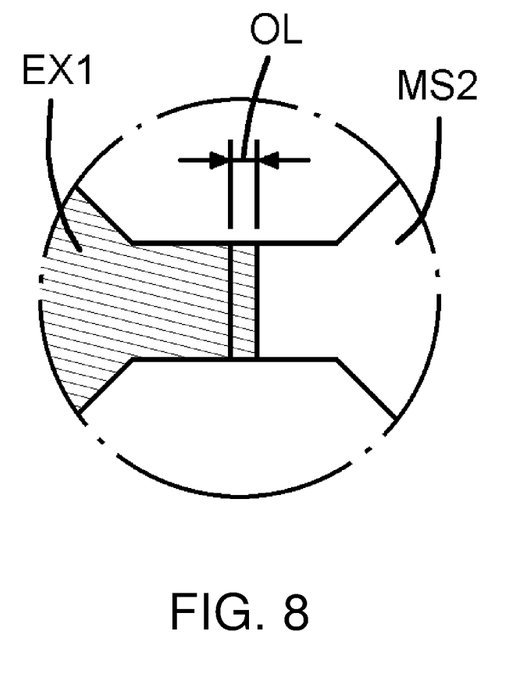
FIG. 8 is an enlarged view of part D in FIG. 6.

As shown in FIG. 2, a large-scale touch sensing pattern S with a size of 550 mm×1100 mm is divided into three divisional patterns S1-S3 with approximately identical sizes, and a size of each of the three divisional patterns S1-S3 must be smaller than a native working size of an exposure machine (550 mm×600 mm). For example, a size of each divisional pattern S1-S3 is width 550 mm×length 400.1 mm, a length of each divisional pattern S1-S3 contains an overlapping pattern portion OL with a width of 0.1 mm as shown in FIG. 8, and the overlapping pattern portion OL guarantees that the multiple divisional patterns S1-S3 can be accurately combined into an integral.

Step b): providing a substrate 10 with a conductive layer 20.

The substrate 10 is a flexible membrane such as a PET film, the conductive layer 20 is a transparent conductive film such as an indium tin oxide (ITO) film, the conductive layer 20 is superposed on the substrate 10, and a size of the conductive layer 20 is greater than 550 mm×1100 mm.

Step c): disposing a photoresist layer 30 on the conductive layer 20.

The dry film photoresist layer 30 is attached on the conductive layer 20 by the roll-to-roll process. The photoresist layer 30 possesses photosensitivity to ultraviolet (UV) rays and contains a color changing agent such as leuco crystal violet. The color changing agent can promote the photoresist layer 30 to change from colorless to colored (blue) when the photoresist layer 30 is irradiated by UV rays for pattern recognition.

Step d): forming a first exposing divisional pattern EX1 and multiple first positioning targets T1 on the photoresist layer 30.

Figure 3:
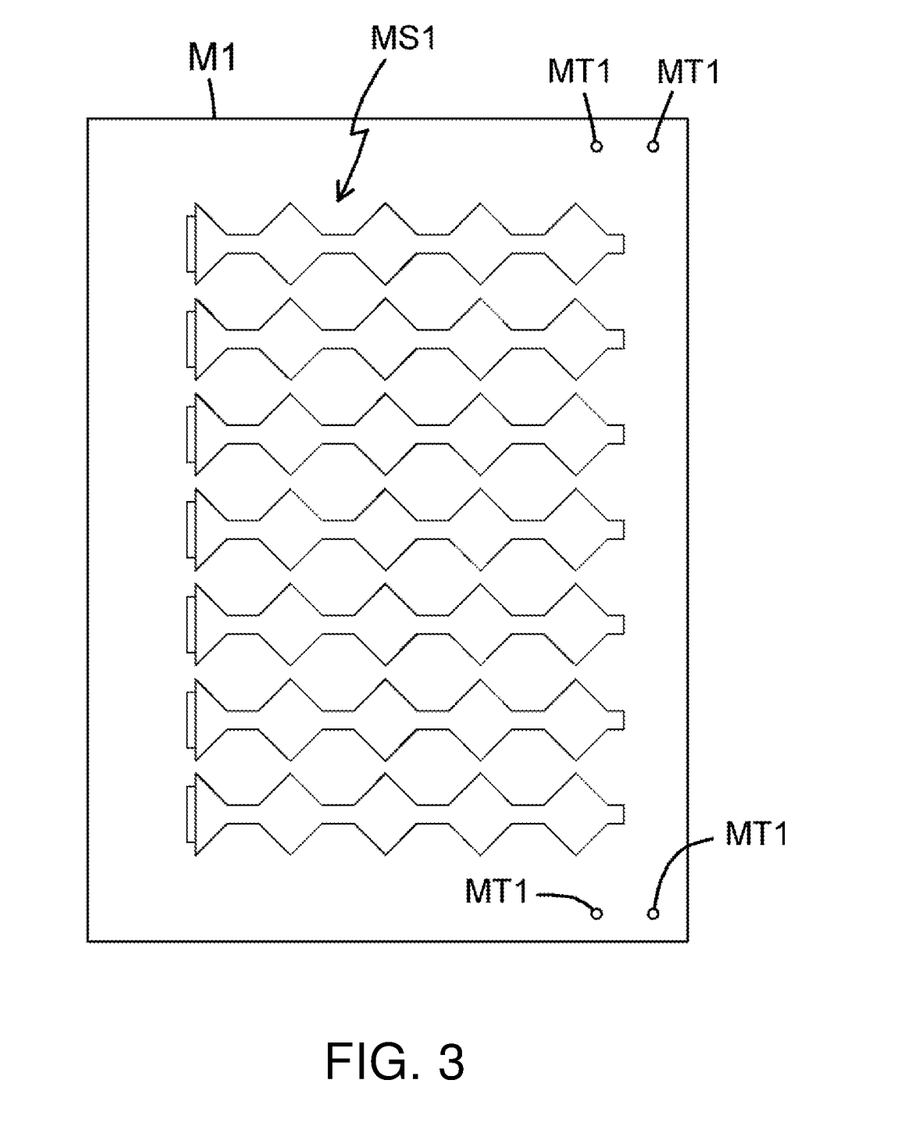
FIG. 3 is a plan view of the first photomask of the invention.
Figure 4:
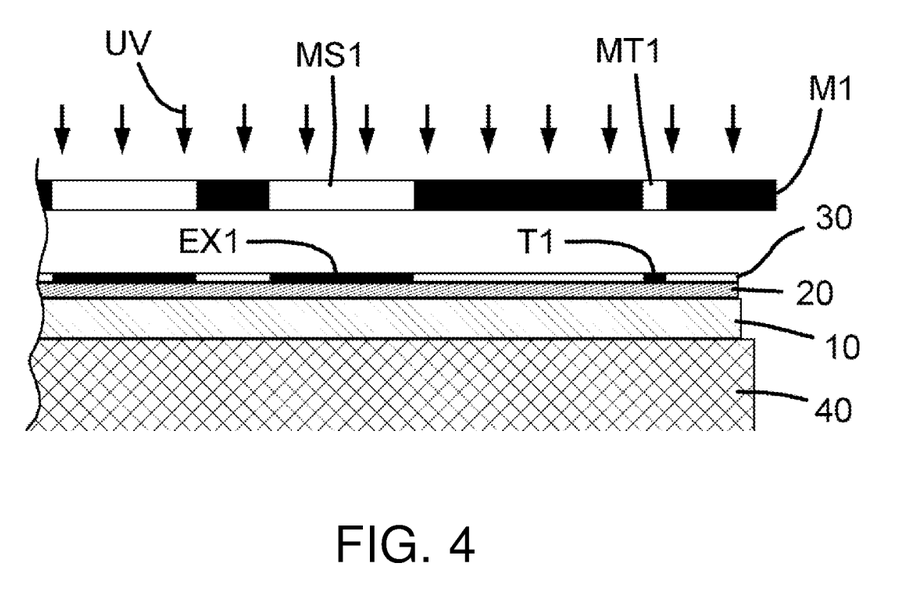
FIG. 4 is a schematic view of the invention, which shows performing an exposure process with the first photomask.

As shown in FIGS. 3 and 4, the substrate 20, the conductive layer 20 and the photoresist layer 30 are laminated and placed on a platform 40 of the exposure machine. The first photomask M1 is disposed above the platform 40, the first photomask M1 has a first divisional pattern mold MS1 corresponding to the first divisional pattern S1 of the large-scale touch sensing pattern and multiple first positioning targets pattern mold MT1. UV rays are used to irradiate the photoresist layer 30 through the first photomask M1 to make photoresist material of the exposed portions generate polymerization to form solidification, and a pattern of the first photomask M1 is transferred onto the photoresist layer 30 to form the first exposing divisional pattern EX1 and multiple first positioning targets T1. The photoresist layer 30 contains a color changing agent, so there will be color difference between photoresist material of the exposed portions and photoresist of the non-exposed portions so as to be advantageous to recognition to the first positioning targets T1. The first positioning targets T1 are arranged outside the first exposing divisional pattern EX1 and apart from each other to increase accuracy of alignment and positioning.

Step e): after positioning the first exposing divisional pattern EX1 of the photoresist layer 30 and a second photomask M2, forming a second exposing divisional pattern EX2 and multiple second positioning targets T2 on the photoresist layer 30.

Figure 5:
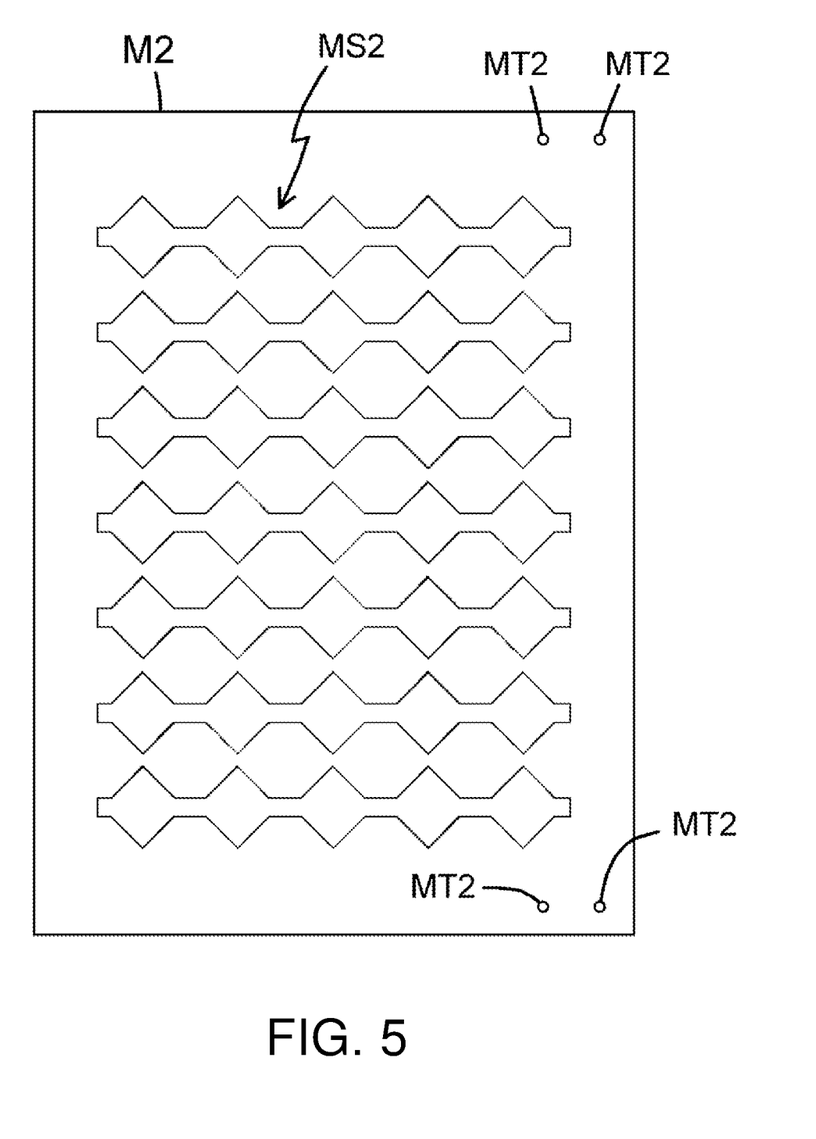
FIG. 5 is a plan view of the second photomask of the invention.
Figure 6:
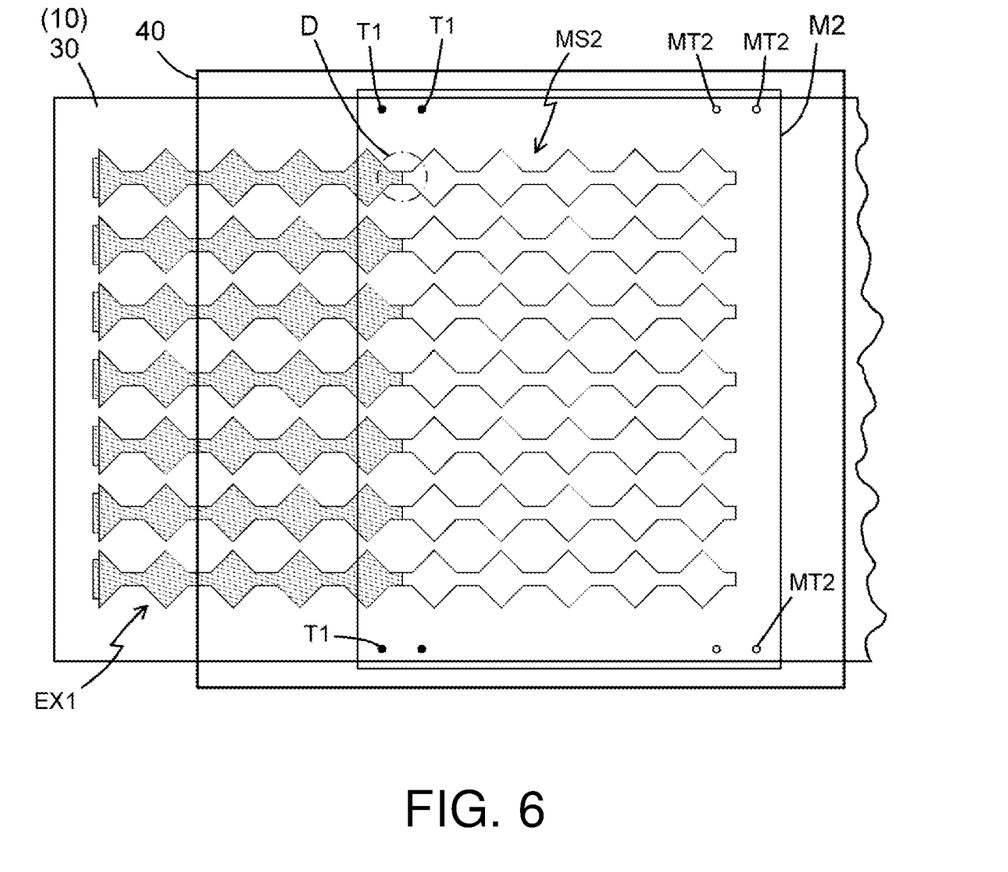
FIG. 6 is a schematic view of the invention, which shows positioning between the first exposing divisional pattern and the second photomask.
Figure 7:
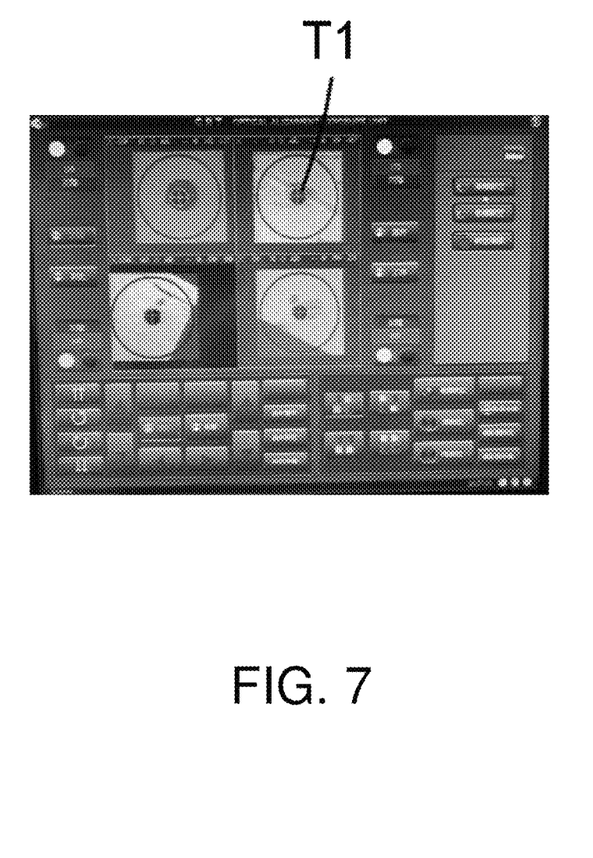
FIG. 7 is a schematic view of the invention, which shows recognizing the first positioning target with a CCD observer.

As shown in FIGS. 5-7, the second photomask M2 has a second pattern mold MS2 corresponding to the second divisional pattern S2 of the large-scale touch sensing pattern and multiple second positioning targets pattern mold MT2. After the second photomask M2 has been disposed above the platform 40 of the exposure machine, it must be aligned and positioned with the workpiece on the platform 40. A light source with wavelength of 620 nm~750 nm is used to irradiate the first positioning targets T1. A CCD observer is used to recognize an image of the first positioning targets T1 to accurately position the first exposing divisional pattern EX1 of the photoresist layer 30 and the second photomask M2. It is noted that according to the experiments, on the photoresist layer 30, there will be color difference between photoresist material of the exposed portions and photoresist of the non-exposed portions when they both are irradiated by blue light with length of 620 nm~750 nm so as to be advantageous to recognition to the first positioning targets T1. Then UV rays are used to irradiate the photoresist layer 30 through the second photomask M2 to transfer a pattern of the second photomask M2 onto the photoresist layer 30 to form a second exposing divisional pattern EX2 and multiple second positioning targets T2. The second exposing divisional pattern EX2 is adjacently connected to the first exposing divisional pattern EX1. The second positioning targets T2 are arranged outside the second exposing divisional pattern EX2 and apart from each other to increase accuracy of alignment and positioning.

Step f): after positioning the second exposing divisional pattern EX2 of the photoresist layer 30 and a third photomask M3, forming a third exposing divisional pattern EX3 on the photoresist layer 30.

Figure 9:
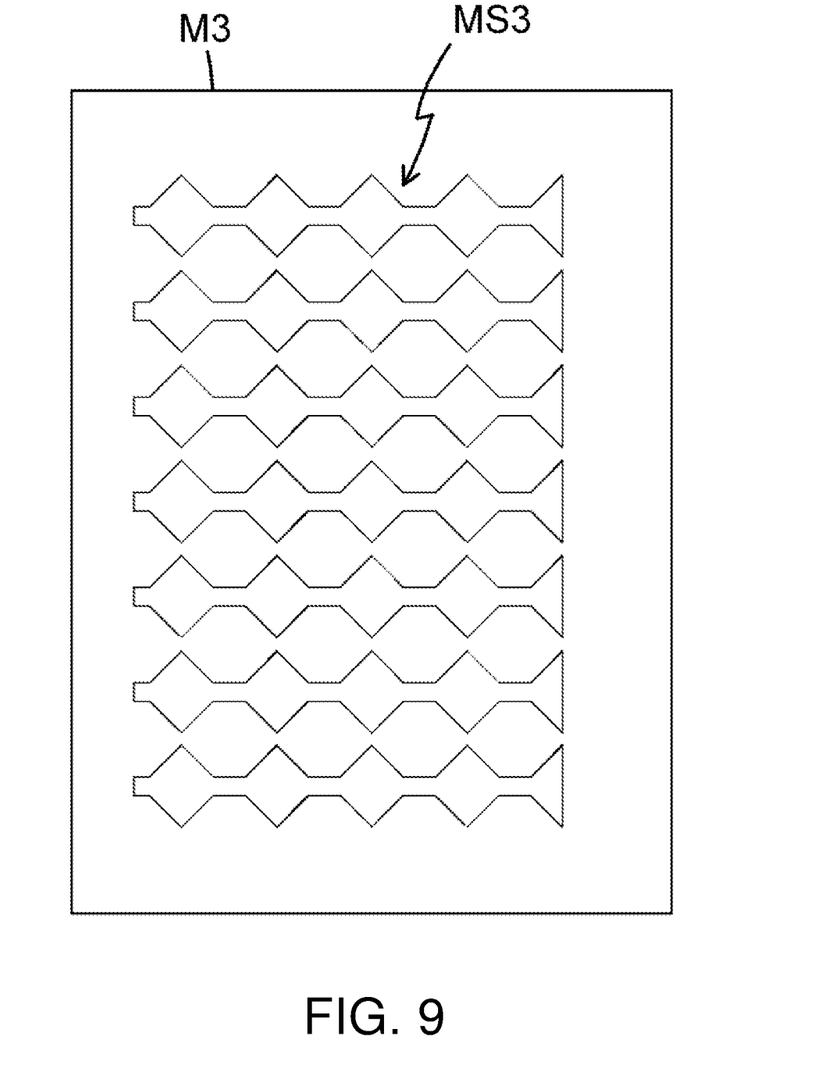
FIG. 9 is a plan view of the third photomask of the invention.
Figure 10:
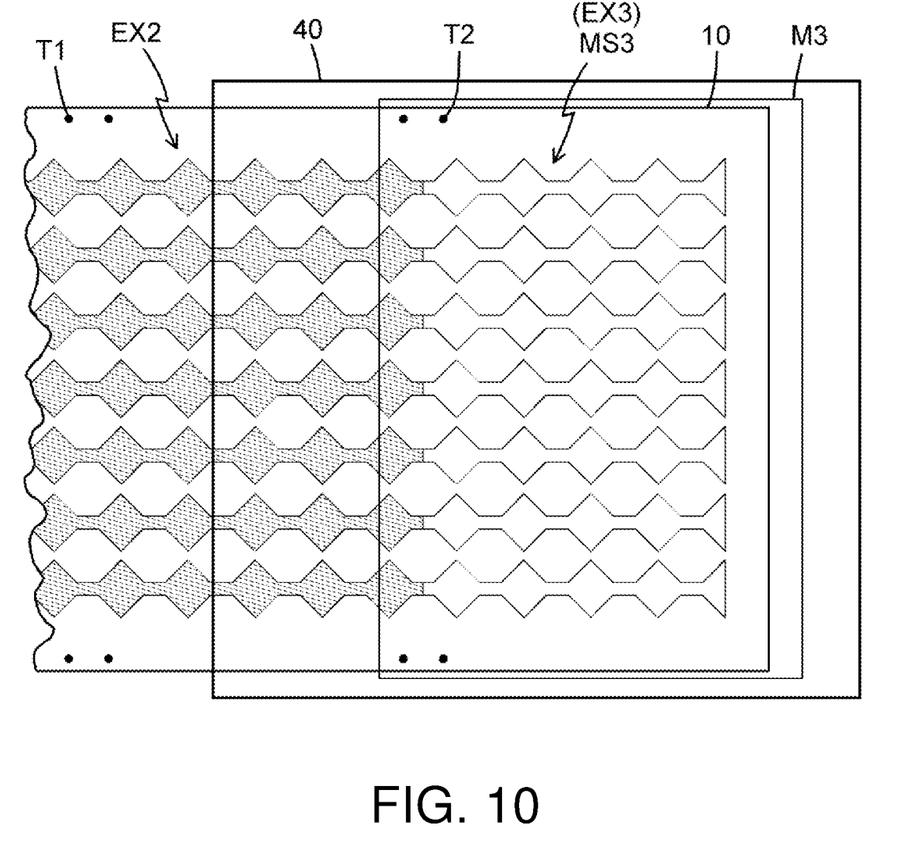
FIG. 10 is a schematic view of the invention, which shows positioning between the second exposing divisional pattern and the third photomask.

As shown in FIGS. 9-10, the third photomask M3 has a third pattern mold MS3 corresponding to the third divisional pattern S3 of the large-scale touch sensing pattern. After the third photomask M3 has been disposed above the platform 40 of the exposure machine, it must be aligned and positioned with the workpiece on the platform 40. A light source with wavelength of 620 nm~750 nm is used to irradiate the second positioning targets T2. A CCD observer is used to recognize an image of the second positioning targets T2 to accurately position the second exposing divisional pattern EX2 of the photoresist layer 30 and the third photomask M3. Then UV rays are used to irradiate the photoresist layer 30 through the third photomask M3 to transfer a pattern of the third photomask M3 onto the photoresist layer 30 to form a third exposing divisional pattern EX3. The third exposing divisional pattern EX3 is adjacently connected to the second exposing divisional pattern EX2. The first exposing divisional pattern EX1, the second exposing divisional pattern EX2 and the third exposing divisional pattern EX3 are jointly connected to be a complete exposing pattern EX with a size of 550 mm×1100 mm. The complete exposing pattern EX corresponds to the large-scale touch sensing pattern S.

Step g): developing the photoresist layer 30 to form a complete exposing pattern EX.

Figure 11:
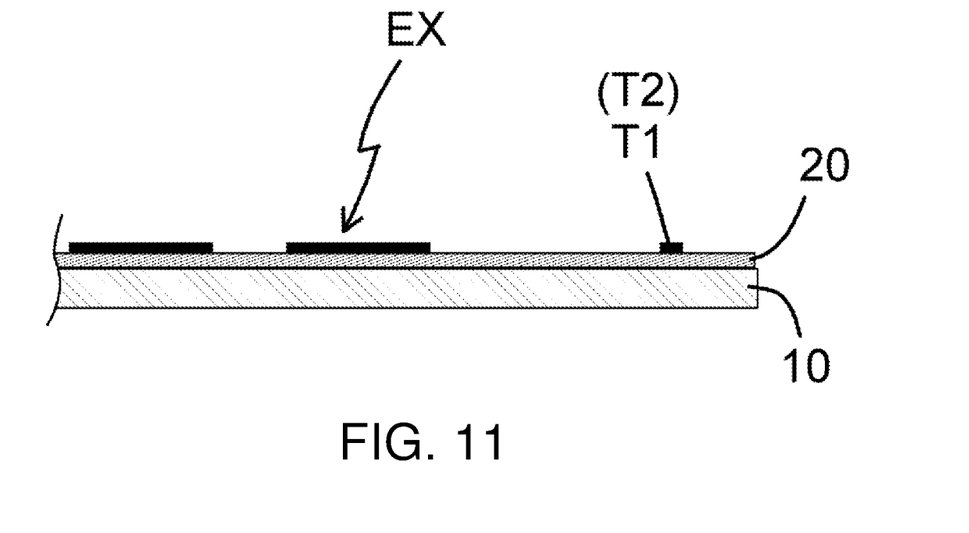
FIG. 11 is a cross-sectional view of the photoresist layer which is treated with a developing process.
Figure 12:
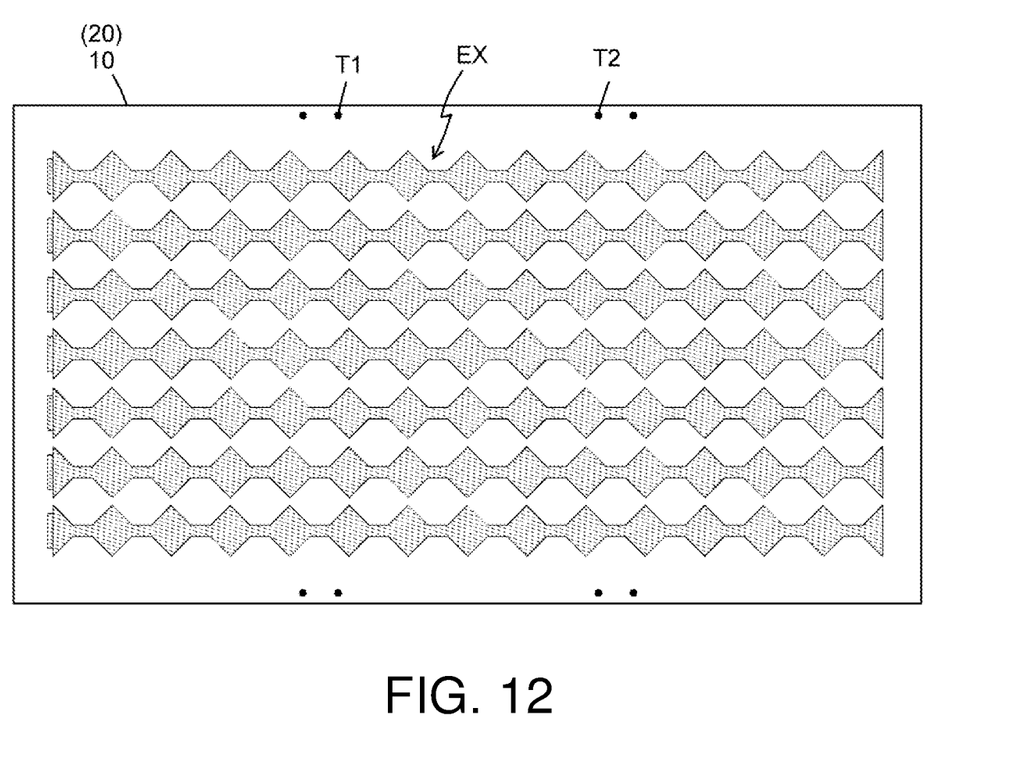
FIG. 12 is a plan view of the photoresist layer which is treated with a developing process.

Developer such as alkaline solvents of potassium carbonate or sodium carbonate is sprayed onto the photoresist layer 30 to remove photoresist material of non-exposed portions of the photoresist layer 30 so as to form a solidified photoresist material layer with the complete exposing pattern EX on the conductive layer 20 as shown in FIGS. 11 and 12.

Step h): etching the conductive layer 20 to form the large-scale touch sensing pattern S.

Figure 13:
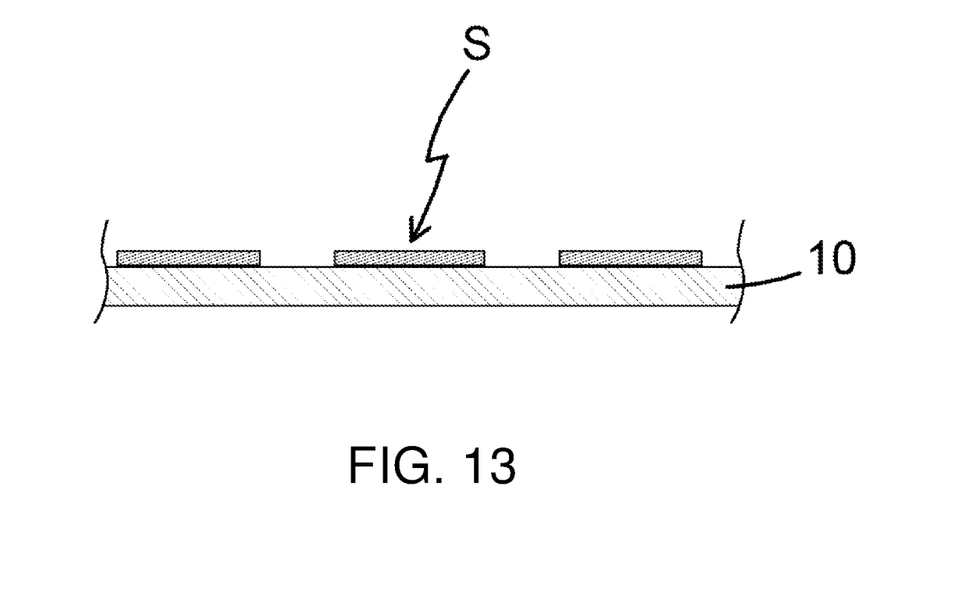
FIG. 13 is a cross-sectional view of the conductive layer which is treated with an etching process.
Figure 14:
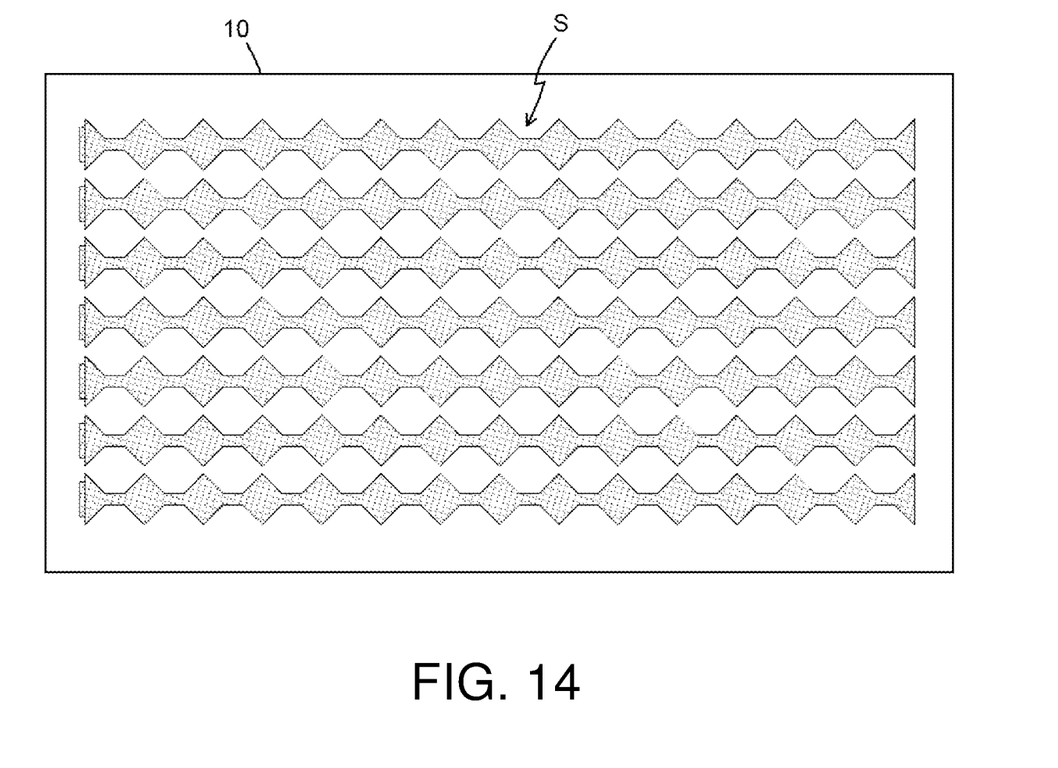
FIG. 14 is a plan view of the conductive layer which is treated with an etching process.

ITO etchant such as ITO etching solution of hydrochloric acid is sprayed onto the conductive layer 20 to remove the ITO material which is not shielded by the solidified photoresist material. As a result, the ITO material portions which are required can be kept on the conductive layer 20 to form the large-scale touch sensing pattern S. Then a stripping agent such as potassium hydroxide or sodium hydroxide is sprayed onto the conductive layer 20 to strip off the photoresist material on the conductive layer 20. Next, wash the conductive layer 20 and the substrate 10 with detergent such as water. As a result, the large-scale touch sensing pattern S with a size of 550 mm×1100 mm is finally manufactured on the substrate 10 as shown in FIGS. 13 and 14.

It will be appreciated by persons skilled in the art that the above embodiment has been described by way of example only and not in any limitative sense, and that various alterations and modifications are possible without departure from the scope of the invention as defined by the appended claims.

What is claimed is:

1. A method for manufacturing a large-scale touch sensing pattern, comprising:
    a) dividing a large-scale touch sensing pattern to be manufactured into multiple divisional patterns and producing multiple photomasks corresponding to the multiple divisional patterns, wherein the multiple divisional patterns comprise a first divisional pattern and adjacent divisional patterns, and margins of the multiple divisional patterns contains overlapping pattern portions;
    b) providing a substrate with a conductive layer;
    c) disposing a photoresist layer on the conductive layer, wherein the photoresist layer possesses photosensitivity to ultraviolet (UV) rays;
    d) performing a first exposure process: using a first photomask to expose the photoresist layer, the first photomask having a first divisional pattern mold and multiple first target pattern molds, a pattern of the first divisional pattern mold corresponding to the first divisional pattern, using UV rays to irradiate the photoresist layer through the first photomask, and transferring a pattern of the first photomask onto the photoresist layer to form an exposing divisional pattern and multiple first targets;
    e) performing an adjacent exposure process: using a light source with wavelength of 620 nm~750 nm to irradiate the first targets of the photoresist layer to perform a positioning operation, after positioning the exposing divisional pattern and an adjacent photomask, using the adjacent photomask to expose the photoresist layer, the adjacent photomask having an adjacent divisional pattern mold and multiple second target pattern molds, a pattern of the adjacent divisional pattern mold corresponding to one of the adjacent divisional patterns of the large-scale touch sensing pattern, using UV rays to irradiate the photoresist layer through the adjacent photomask, transferring a pattern of the adjacent photomask onto the photoresist layer to form an adjacent exposing divisional pattern and multiple second targets, and adjacently connecting the adjacent exposing divisional pattern and the exposing divisional pattern originally on the photoresist layer;
    f) repeating the adjacent exposure process to form multiple adjacent exposing divisional patterns until a complete exposing pattern has been assembled, the complete exposing pattern corresponding to the large-scale touch sensing pattern;

g) performing a developing process to the photoresist layer to form a solidified photoresist layer with the complete exposing pattern on the conductive layer; and h) etching the conductive layer to form the large-scale touch sensing pattern on the conductive layer.

2. The method of claim 1, wherein each of the overlapping pattern portions is less than 0.1 mm in width.

3. The method of claim 1, wherein the photoresist layer comprises a color changing agent for promoting the photoresist layer to change from colorless to colored when the photoresist layer is irradiated by UV rays.

4. The method of claim 3, wherein the color changing agent is leuco crystal violet, diphenylamine, triphenylamine or dibenzylaniline.

5. The method of claim 1, wherein the targets are arranged outside the exposing divisional patterns and apart from each other.

* * * * *